US012802738B2

(12) United States Patent
Seol et al.

(10) Patent No.: US 12,802,738 B2

(45) Date of Patent: Nov. 17, 2026

(54) MEMORY SYSTEM CAPABLE OF COPING WITH CHANGES IN POWER RAIL

(71) Applicant: SAMSUNG ELECTRONICS CO., LTD., Suwon-si (KR)

(72) Inventors: Hoseok Seol, Suwon-si (KR); Kiheung Kim, Suwon-si (KR); Hyongryol Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 57 days.

(21) Appl. No.: 18/828,789

(22) Filed: Sep. 9, 2024

(65) Prior Publication Data

US 2025/0266078 A1 Aug. 21, 2025

(30) Foreign Application Priority Data

Feb. 16, 2024 (KR) ........................ 10-2024-0022395

(51) Int. Cl.

| | |
|---|---|
| ***G11C 11/4074*** | (2006.01) |
| ***G11C 5/14*** | (2006.01) |
| *G05F 1/575* | (2006.01) |
| *H02M 3/158* | (2006.01) |
| *H10W 90/00* | (2026.01) |

(52) U.S. Cl.

CPC .......... *G11C 11/4074* (2013.01); *G11C 5/147* (2013.01); *G05F 1/575* (2013.01); *H02M 3/158* (2013.01); *H10W 90/00* (2026.01)

(58) Field of Classification Search

CPC . G11C 11/4074; G11C 11/406; G11C 11/401; G11C 5/147; G11C 11/4076; G05F 1/575; H02M 3/158; H02M 1/10; H10W 90/00; H02J 1/00; H02J 1/06

See application file for complete search history.

(56) References Cited

U.S. PATENT DOCUMENTS

| | | | | |
|---|---|---|---|---|
| 7,523,373 | B2 * | 4/2009 | Russell | G11C 29/50016 713/300 |
| 7,642,672 | B2 | 1/2010 | Strauss | |
| 8,988,140 | B2 * | 3/2015 | Graf | G05F 1/46 323/267 |
| 9,690,365 | B2 | 6/2017 | Mair et al. | |
| 10,488,913 | B2 | 11/2019 | Heo et al. | |
| 11,199,866 | B2 | 12/2021 | Mori et al. | |

(Continued)

FOREIGN PATENT DOCUMENTS

| | | | |
|---|---|---|---|
| CN | 106095037 | A | 11/2016 |
| KR | 10-2387203 | B1 | 4/2022 |

*Primary Examiner* — Mushfique Siddique

(74) *Attorney, Agent, or Firm* — Sughrue Mion, PLLC

(57) ABSTRACT

A semiconductor device includes: a first voltage terminal; a second voltage terminal; a voltage regulator configured to convert a first power supply voltage provided through the first voltage terminal to a second power supply voltage lower than the first power supply voltage; a first internal circuit configured to: receive the first power supply voltage from the first voltage terminal, and operate based on the first power supply voltage; and a second internal circuit configured to: receive the second power supply voltage from the second voltage terminal or the voltage regulator, based on a mode signal indicating a single power rail mode (SPRM) or a dual power rail mode (DPRM), and operate based on the second power supply voltage.

19 Claims, 18 Drawing Sheets

(56) References Cited

U.S. PATENT DOCUMENTS

| | | | | |
|---|---|---|---|---|
| 2005/0219903 | A1* | 10/2005 | Daga | G11C 5/14 365/185.18 |
| 2014/0313819 | A1* | 10/2014 | Choi | G11C 5/14 365/156 |
| 2015/0036446 | A1* | 2/2015 | Kenkare | H02J 1/082 307/29 |
| 2015/0187402 | A1* | 7/2015 | Chun | G11C 8/10 365/230.02 |
| 2017/0083034 | A1* | 3/2017 | Yang | G05F 1/575 |
| 2020/0066324 | A1* | 2/2020 | He | G11C 11/40615 |
| 2020/0089310 | A1 | 3/2020 | Heo et al. | |

* cited by examiner

FIG. 10

MR13

| OP[7] | OP[6] | OP[5] | OP[4] | OP[3] | OP[2] | OP[1] | OP[0] |
| --- | --- | --- | --- | --- | --- | --- | --- |
| DUAL VDD2 | CBT MODE | DMD | DMI I/O CONTROL | RFU | VRO | THERMAL OFFSET | |

| MD | SWI | SWO | SWB |
|---|---|---|---|
| H(DPRM) | OFF | OFF | ON |
| L(SPRM) | ON | ON | OFF |

MEMORY SYSTEM CAPABLE OF COPING WITH CHANGES IN POWER RAIL

CROSS-REFERENCE TO RELATED APPLICATION

This application is based on and claims priority under 35 U.S.C. § 119 to Korean Patent Application No. 10-2024-0022395, filed on Feb. 16, 2024, in the Korean Intellectual Property Office, the disclosure of which is incorporated by reference herein in its entirety.

BACKGROUND

1. Field

The disclosure relates to semiconductor integrated circuits, and more particularly to a semiconductor memory device and a memory system.

2. Description of Related Art

As the number of power rails to supply power to semiconductor devices (such as memory devices) increases, the number of passive elements (such as inductors and capacitors associated with the power rails) also increases. Therefore, as the number of power rails increases, the size and cost of the system containing the semiconductor devices increases.

For example, according to a dual power rail scheme, power supply voltages of 0.875 V and 1.0 V may be supplied to a dynamic random access memory (DRAM) device. For computing applications that emphasize cost over power, a single power rail scheme of 1.0 V may be applied. Applying 1.0 V to a circuit containing transistors designed for 0.875 V for a single power rail scheme may cause reliability issues with the behavior of the transistors and may change the timing margin of the operation, and thus, additional compensation circuitry may be required.

SUMMARY

Provided are a semiconductor device, a semiconductor memory device, and a memory system, capable of efficiently coping with changes in a power rail mode.

According to an aspect of the disclosure, a semiconductor device includes: a first voltage terminal; a second voltage terminal; a voltage regulator configured to convert a first power supply voltage provided through the first voltage terminal to a second power supply voltage lower than the first power supply voltage; a first internal circuit configured to: receive the first power supply voltage from the first voltage terminal, and operate based on the first power supply voltage; and a second internal circuit configured to: receive the second power supply voltage from the second voltage terminal or the voltage regulator, based on a mode signal indicating a single power rail mode (SPRM) or a dual power rail mode (DPRM), and operate based on the second power supply voltage.

According to an aspect of the disclosure, a semiconductor memory device includes: a first voltage terminal; a second voltage terminal; a voltage regulator configured to convert a first power supply voltage provided through the first voltage terminal to a second power supply voltage lower than the first power supply voltage; a memory core circuit configured to: receive the first power supply voltage from the first voltage terminal, and operate based on the first power supply voltage; and a peripheral circuit configured to: receive the second power supply voltage from either the second voltage terminal or the voltage regulator, based on a mode signal indicating a single power rail mode (SPRM) or a dual power rail mode (DPRM), and operate based on the second power supply voltage.

According to an aspect of the disclosure, A memory system includes: a semiconductor memory device; a memory controller configured to control the semiconductor memory device; one or more power rails; and a power management integrated circuit configured to supply power to the semiconductor memory device and the memory controller via the one or more power rails, wherein the semiconductor memory device comprises, a first voltage terminal; a second voltage terminal; a voltage regulator configured to convert a first power supply voltage provided through the first voltage terminal to a second power supply voltage lower than the first power supply voltage; a memory core circuit configured to: receive the first power supply voltage from the first voltage terminal, and operate based on the first power supply voltage; and a peripheral circuit configured to: receive the second power supply voltage from either the second voltage terminal or the voltage regulator, based on a mode signal indicating a single power rail mode (SPRM) or a dual power rail mode (DPRM), and operate based on the second power supply voltage.

According to example embodiments, the semiconductor device and the memory system may efficiently provide power supply voltages for internal circuits in response to changes in a power rail mode, thereby efficiently addressing reliability issues and timing margin issues associated with changes in the power rail mode.

BRIEF DESCRIPTION OF DRAWINGS

The above and other aspects, features, and advantages of certain embodiments of the disclosure will be more apparent from the following description taken in conjunction with the accompanying drawings, in which:

FIG. 10 is a diagram illustrating example information in a mode register of a semiconductor memory device according to example embodiments;

DETAILED DESCRIPTION

Figure 1:
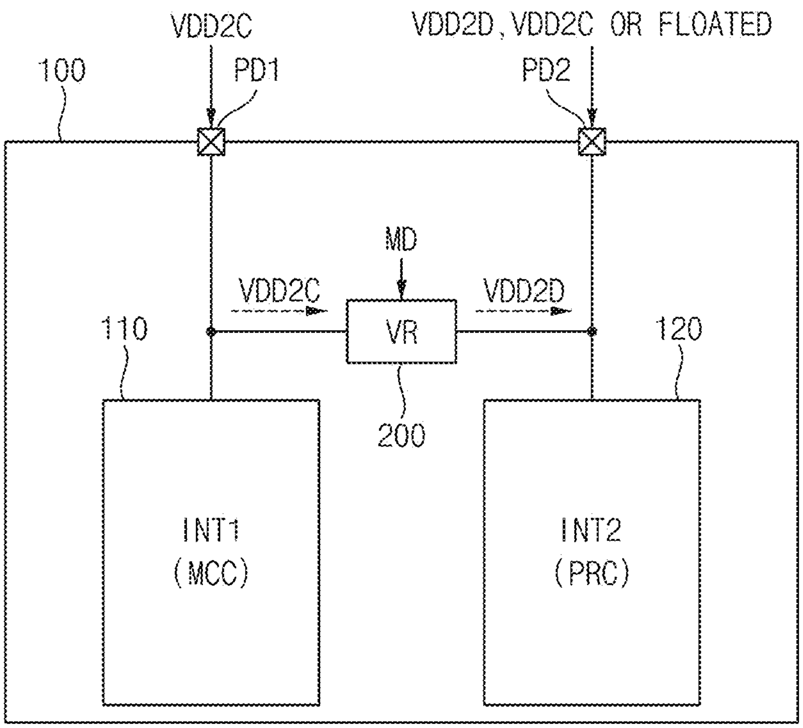
FIG. 1 is a block diagram illustrating a semiconductor device according to example embodiments.

Various example embodiments will be described more fully hereinafter with reference to the accompanying drawings, in which some example embodiments are shown. In the drawings, like numerals refer to like elements throughout. The repeated descriptions may be omitted.

The description merely illustrates the principles of the disclosure. Those skilled in the art will be able to devise one or more arrangements that, although not explicitly described herein, embody the principles of the disclosure. Furthermore, all examples recited herein are principally intended expressly to be only for explanatory purposes to help the reader in understanding the principles of the disclosure and the concepts contributed by the inventor to furthering the art and are to be construed as being without limitation to such specifically recited examples and conditions. Moreover, all statements herein reciting principles, aspects, and embodiments of the disclosure, as well as specific examples thereof, are intended to encompass equivalents thereof.

Terms used in the disclosure are used only to describe a specific embodiment, and may not be intended to limit the scope of another embodiment. A singular expression may include a plural expression unless it is clearly meant differently in the context. The terms used herein, including a technical or scientific term, may have the same meaning as generally understood by a person having ordinary knowledge in the technical field described in the present disclosure. Terms defined in a general dictionary among the terms used in the present disclosure may be interpreted with the same or similar meaning as a contextual meaning of related technology, and unless clearly defined in the present disclosure, it is not interpreted in an ideal or excessively formal meaning. In some cases, even terms defined in the disclosure cannot be interpreted to exclude embodiments of the present disclosure.

In one or more embodiments of the disclosure described below, a hardware approach is described as an example. However, since the one or more embodiments of the disclosure include technology that uses both hardware and software, the various embodiments of the present disclosure do not exclude a software-based approach.

In addition, in the disclosure, in order to determine whether a specific condition is satisfied or fulfilled, an expression of more than or less than may be used, but this is only a description for expressing an example, and does not exclude description of more than or equal to or less than or equal to. A condition described as 'more than or equal to' may be replaced with 'more than', a condition described as 'less than or equal to' may be replaced with 'less than', and a condition described as 'more than or equal to and less than' may be replaced with 'more than and less than or equal to'.

The terms "include" and "comprise", and the derivatives thereof refer to inclusion without limitation. The term "or" is an inclusive term meaning "and/or". The phrase "associated with," as well as derivatives thereof, refer to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of A, B, and C" includes any of the following combinations: A, B, C, A and B, A and C, B and C, and A and B and C, and any variations thereof. As an additional example, the expression "at least one of a, b, or c" may indicate only a, only b, only c, both a and b, both a and c, both b and c, all of a, b, and c, or variations thereof. Similarly, the term "set" means one or more. Accordingly, the set of items may be a single item or a collection of two or more items.

FIG. 1 is a block diagram illustrating a semiconductor device according to example embodiments.

Referring to FIG. 1, a semiconductor device 100 may include a first voltage terminal PD1, a second voltage terminal PD2, a voltage regulator (VR) 200, a first internal circuit (INT1) 110, and a second internal circuit (INT2) 120.

Although only the first voltage terminal PD1 and the second voltage terminal PD2 are illustrated in FIG. 1, the semiconductor device 100 may further include various other terminals, such as data terminals, address-command terminals, control signal terminals, and the like. Also, although one first voltage terminal PD1 and one second voltage terminal PD2 are shown in FIG. 1, a plurality of first voltage terminals PD1 may receive one voltage, and a plurality of second voltage terminals PD2 may receive another voltage. The voltage terminals may also be referred to as voltage pads or voltage pins.

As will be described below with reference to FIGS. 2, 3 and 4, the first voltage terminal PD1 may receive a first power supply voltage VDD2C regardless of the power rail mode. The second voltage terminal PD2 may receive the first power supply voltage VDD2C, may receive a second power supply voltage VDD2D or may be floated, depending on a power rail mode.

The voltage regulator 200 may be configured to convert the first power supply voltage VDD2C provided through the first voltage terminal PD1 to generate the second power supply voltage VDD2D that is lower than the first power supply voltage VDD2C. As will be described below with reference to FIGS. 5 and 6, the voltage regulator 200 may be implemented in various types and configurations.

The first internal circuit 110 may be configured to receive the first power supply voltage VDD2C from the first voltage terminal PD1 and operate based on the first power supply voltage VDD2C.

The second internal circuit 120 may be configured to receive the second power supply voltage VDD2D from the second voltage terminal PD2 or from the voltage regulator 200, based on a mode signal MD indicating a single power rail mode (SPRM) or a dual power rail mode (DPRM). The second internal circuit 120 may be configured to operate based on the second power supply voltage VDD2D.

The transistors included in the first internal circuit 110 may be designed for the (relatively high) first power supply voltage VDD2C. The transistors included in the second internal circuit 120 may be designed for the (relatively low)

second power supply voltage VDD2D. For example, the length of the channel, the width of the channel, and the thickness of the oxide film of the transistors may be designed differently depending on the power supply voltage.

In an example embodiment, the semiconductor device 100 may be a DRAM device. In this case, the first internal circuit 110 may be a memory core circuit (MCC) including a memory cell array, a sense amplifier, a word line driver, and the like, and the second internal circuit 120 may be a peripheral circuit (PRC) other than the MCC.

According to example embodiments, the voltage regulator 200 may be selectively enabled based on the mode signal MD. As will be described below with reference to FIG. 2, the voltage regulator 200 may be disabled in the dual power rail mode (DPRM). On the other hand, as will be described below with reference to FIGS. 3 and 4, the voltage regulator 200 may be enabled in the SPRM, and thus, the voltage regulator 200 may convert the first power supply voltage VDD2C to generate the second power supply voltage VDD2D that is lower than the first power supply voltage VDD2C. The voltage regulator 200 may provide the generated second power supply voltage VDD2D to the second internal circuit 120, as shown in FIG. 1.

The power rail mode of the disclosure includes the DPRM and the SPRM. The power rail mode may be determined by implementation of a system including the semiconductor device 100. For example, the system may include various components including the semiconductor device 100 mounted on a printed circuit board (PCB), and the components may be electrically connected to each other via conductive paths formed on the printed circuit board, wire bonding, or the like. For example, a power supply (such as a power management integrated circuit (PMIC)) and the semiconductor device 100 may be connected via one or more power rails. The power rails may provide one or more power supply voltages from the power supply to the semiconductor device 100.

According to example embodiments, the mode signal MD indicating the power rail mode applied to the system may be provided to the semiconductor device 100 in a variety of ways. In an example embodiment, as will be further described with reference to FIG. 10, the semiconductor device 100 may further include a 'mode register' storing control values for controlling the operation of the semiconductor device 100. The mode signal MD may be generated based on the control values stored in the mode register. In an example embodiment, as will be described below with reference to FIGS. 11 and 12, the semiconductor device 100 may further include a voltage monitor to monitor the voltage of the second voltage terminal PD2 to generate the mode signal MD.

As the number of power rails increases, the size and cost of a system including the semiconductor device increase. In the related art, there are attempts to power the semiconductor device 100 in the SPRM even though the semiconductor device 100 is designed for the DPRM. In this case, reliability issues with the operation of the transistors may arise and the timing margins of the operation may be altered, requiring additional compensation circuitry.

The semiconductor device 100 according to example embodiments may efficiently address the reliability issues and timing margin issues associated with changing power rail modes by efficiently providing power supply voltages for internal circuits in response to changes in the power rail mode.

Figure 2:
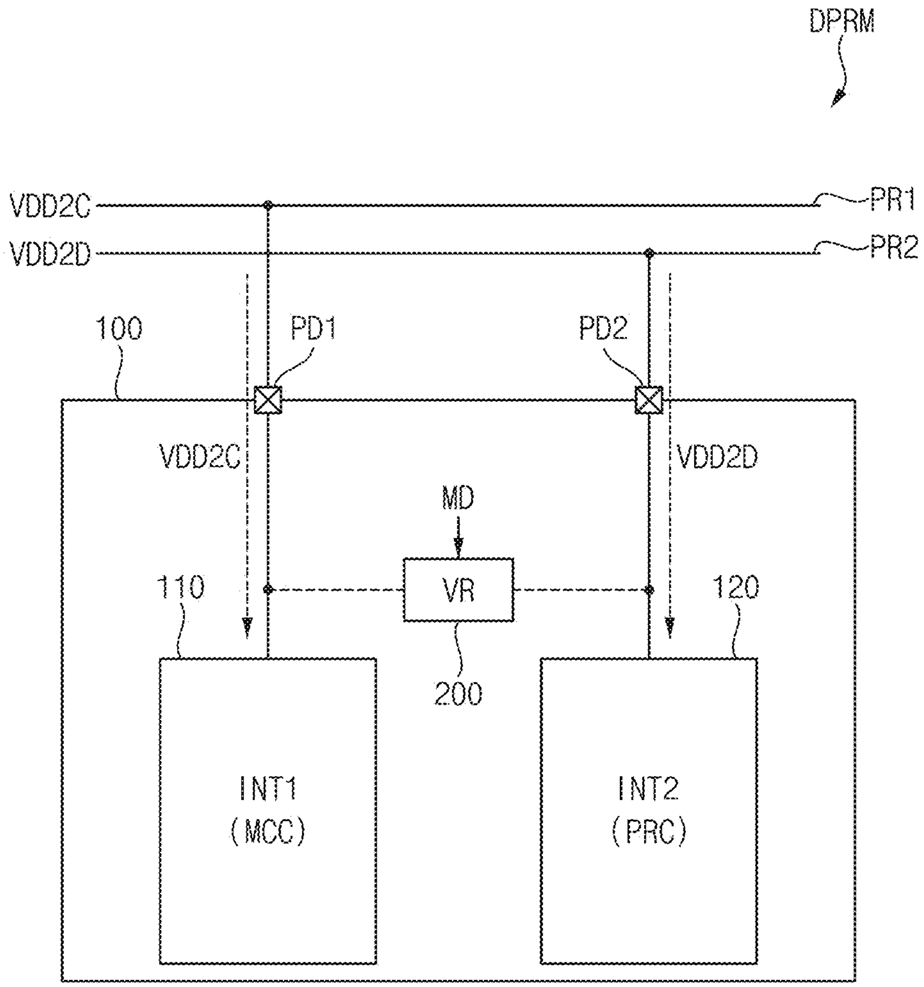
FIG. 2 is a diagram illustrating a semiconductor device to which a dual power rail mode (DPRM) is applied according to example embodiments.

FIG. 2 is a diagram illustrating a semiconductor device to which the DPRM is applied according to example embodiments.

Referring to FIG. 2, the semiconductor device 100, in the DPRM, may receive the first power supply voltage VDD2C via a first power rail PR1 connected to the first voltage terminal PD1 and may receive the second power supply voltage VDD2D via a second power rail PR2 connected to the second voltage terminal PD2.

In the DPRM, the voltage regulator 200 may be disabled. As a result, the first internal circuit 110 may receive the first power supply voltage VDD2C from the first voltage terminal PD1, and the second internal circuit 120 may receive the second power supply voltage VDD2D from the second voltage terminal PD2.

Figure 3:
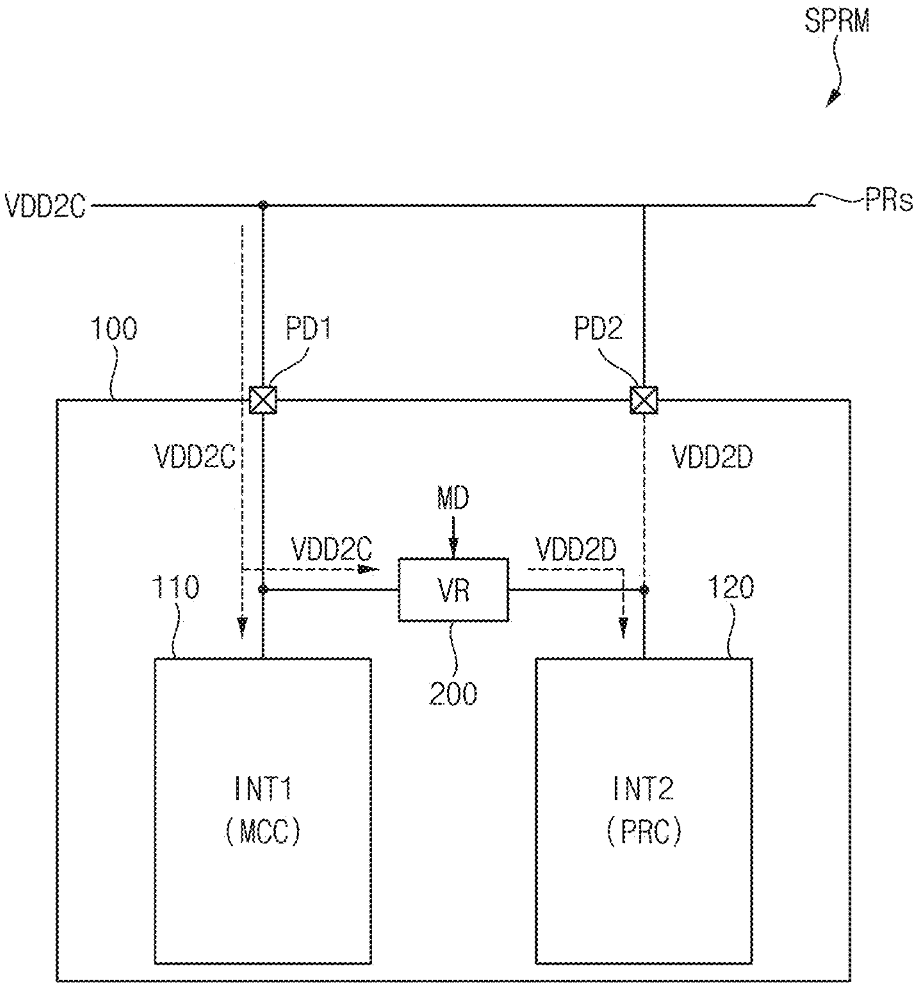
FIGS. 3 and 4 are diagrams illustrating a semiconductor device to which a single power rail mode (SPRM) is applied according to example embodiments.
Figure 4:
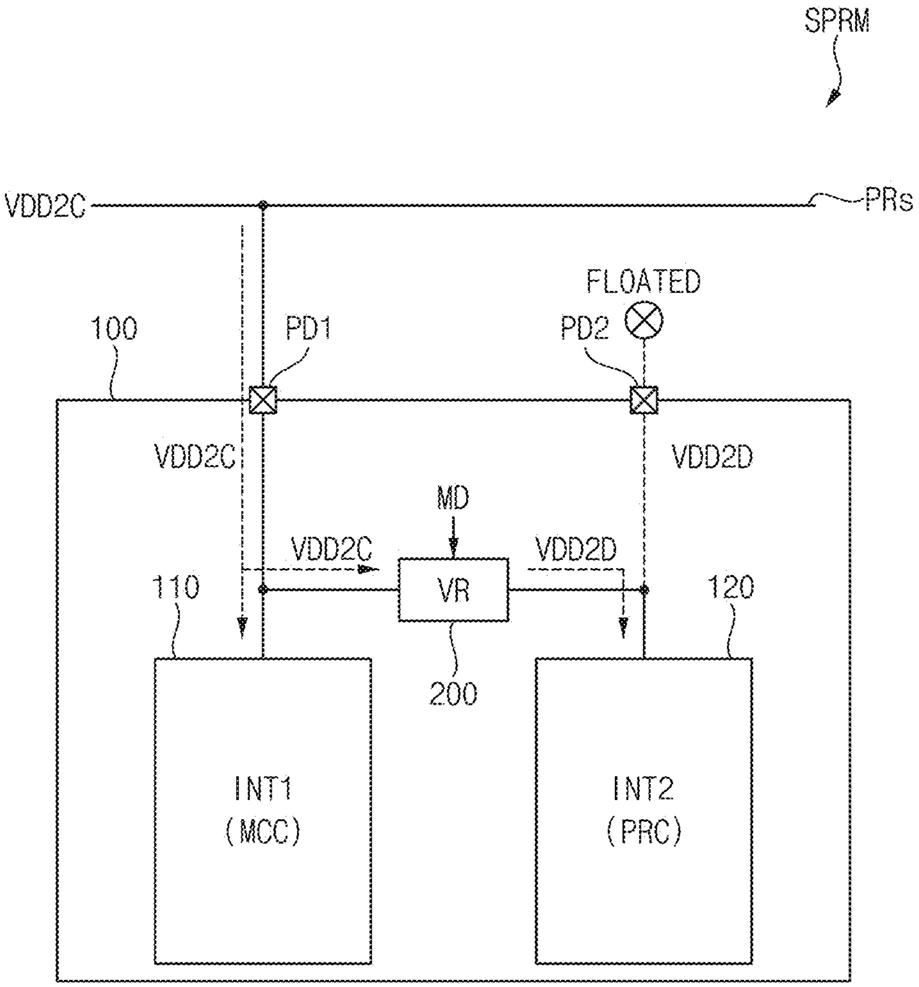

FIGS. 3 and 4 are diagrams illustrating a semiconductor device to which the SPRM is applied according to example embodiments.

In an example embodiment, as shown in FIG. 3, in the SPRM, the semiconductor device 100 may receive the first power supply voltage VDD2C via a power rail PRs connected in common to the first voltage terminal PD1 and the second voltage terminal PD2.

In another example embodiment, as shown in FIG. 4, in the SPRM, the semiconductor device 100 may receive the first power supply voltage VDD2C through the power rail PRs connected to the first voltage terminal PD1 and the second voltage terminal PD2 may be floated without being connected to a power rail.

In the SPRM, the voltage regulator 200 may be enabled to generate the second power supply voltage VDD2D. As a result, the first internal circuit 110 may receive the first power supply voltage VDD2C from the first voltage terminal PD1, and the second internal circuit 120 may receive the second power supply voltage VDD2D from the voltage regulator 200.

As described with reference to FIGS. 2, 3 and 4, the first internal circuit 110 may receive the first power supply voltage VDD2C and operate based on the first power supply voltage VDD2C regardless of the power rail mode, and the second internal circuit 120 may receive the second power supply voltage VDD2D and operate based on the second power supply voltage VDD2D regardless of the power rail mode. Each of the first internal circuit 110 and the second internal circuit 120 may operate based on a voltage suitable for their respective configurations and designs regardless of the power rail mode, and thus, performance reduction of the semiconductor device 100 may be prevented even if the power rail mode is changed.

Figure 5:
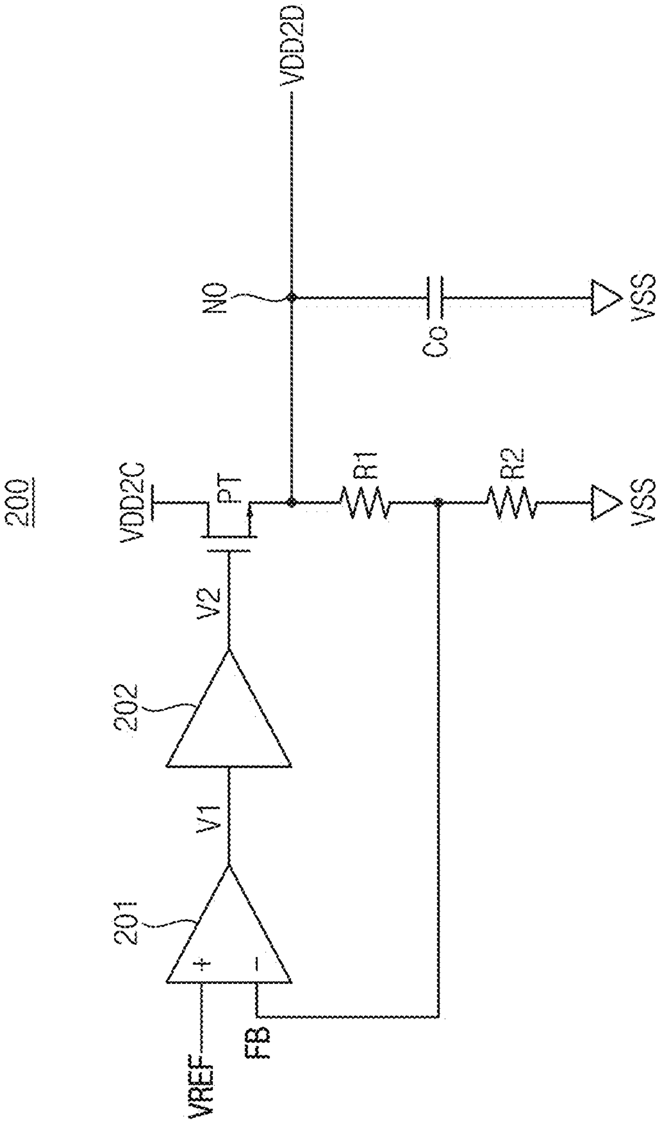
FIGS. 5 and 6 are diagrams illustrating example embodiments of a voltage regulator included in a semiconductor device according to example embodiments.
Figure 6:
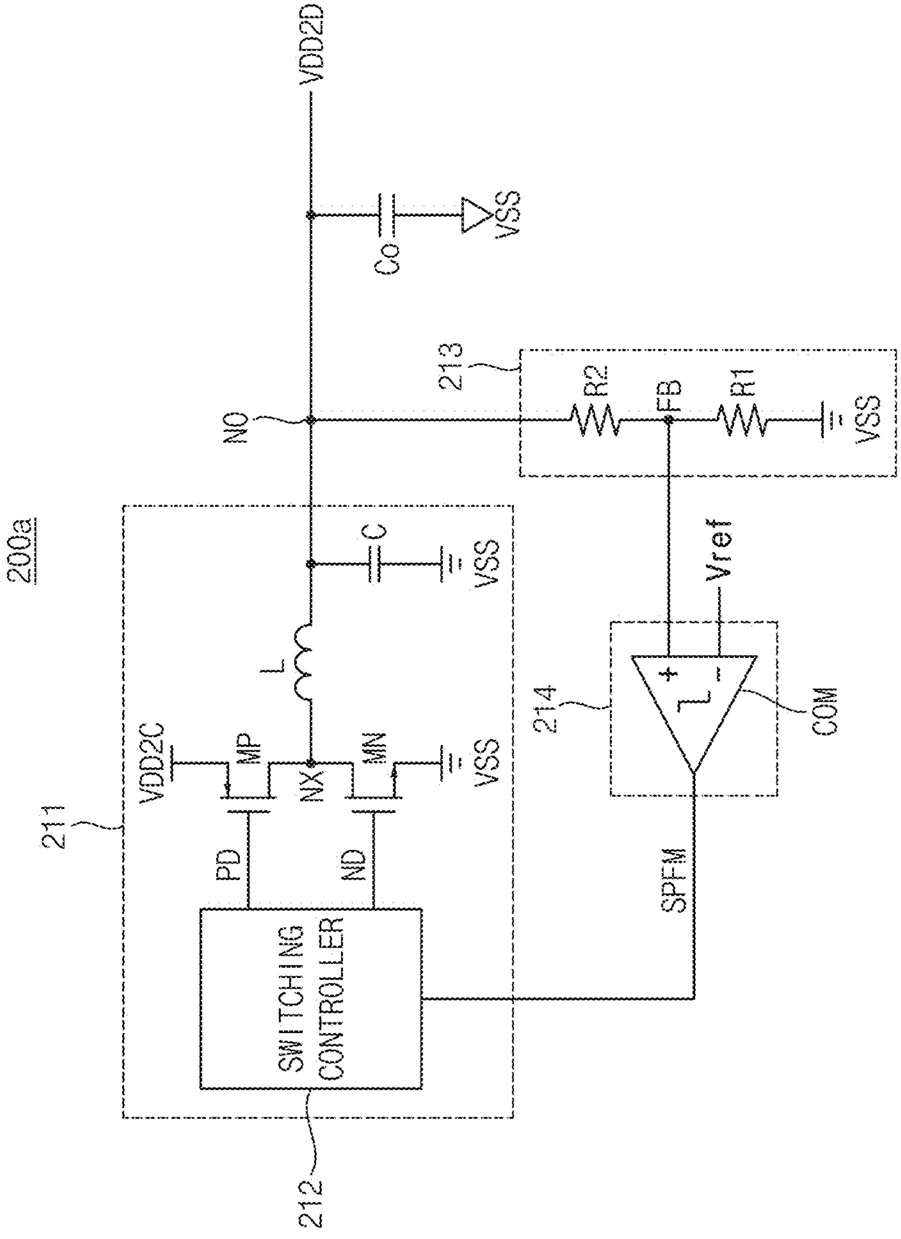

FIGS. 5 and 6 are diagrams illustrating example embodiments of a voltage regulator included in a semiconductor device according to example embodiments.

In general, a PMIC of a system may use a voltage regulator to provide a power supply voltage to an application processor, a memory device, or various electronic circuits. The voltage regulator may be configured to provide a constant level of voltage to various devices. Voltage regulators may be broadly categorized into linear regulators and switching regulators, depending on how they regulate the voltage. Switching regulators are more efficient but have poor noise characteristics. On the other hand, linear regulators are less efficient but have good noise characteristics. Because of their good noise characteristics, linear regulators may supply precise and stable voltages. Referring now to FIGS. 5 and 6, the voltage regulator 200 included in the semiconductor device 100 according to embodiments of the present disclosure will be described, but example embodiments are not limited to any particular type of voltage regulator.

FIG. 5 illustrates an embodiment in which the voltage regulator 200 of FIG. 1 is implemented as a low drop-out (LDO) regulator.

The LDO regulator is a type of linear regulator and is used to reliably power various types of electronic devices. For example, the LDO regulator may be used in PMICs in mobile devices such as smartphones or tablet PCs. The LDO regulator is configured to compensate for changes in the output voltage, typically based on a feedback voltage corresponding to the output voltage.

Referring to FIG. 5, the voltage regulator 200 may include a compensator 201, a buffer circuit 202, a pass transistor PT, a first resistor R1, a second resistor R2, and an output capacitor Co.

The output capacitor Co may be connected between an output node NO, from which a second power supply voltage VDD2D corresponding to the output voltage is output, and a ground node (e.g., a node connected to the ground voltage VSS) from which the second power supply voltage VDD2D is output. The first resistor R1 and the second resistor R2 may be connected in series between the output node NO and the ground voltage VSS. Through the node between the first resistor R1 and the second resistor R2, a feedback voltage BF may be output from which the second power supply voltage VDD2D is distributed or sampled.

To the non-inverting input end (+) of the compensator 201, a reference voltage VREF may be input, and to the inverting input end (−) of the compensator 201, the feedback voltage FB may be input. The compensator 201 may output a first voltage V1 based on the difference between the reference voltage VREF and the feedback voltage FB.

The buffer circuit 202 may receive the first voltage V1 that is the output of the compensator 201, amplify the first voltage V1, and output a second voltage V2. In one embodiment, the buffer circuit 202 may be a unity buffer, and the first voltage V1 and the second voltage V2 may have the same level as each other.

The pass transistor PT may be connected between the first power supply voltage VDD2C and the output node NO, and may be configured to operate in response to the second voltage V2. In one embodiment, the pass transistor PT may be an N-type metal oxide semiconductor (NNOS) transistor, but example embodiments are not limited thereto.

The voltage regulator 200 may compensate for changes in the second power supply voltage VDD2D by controlling the pass transistor PT in response to changes in the second power supply voltage VDD2D corresponding to the output voltage. For example, if the load current used by the load circuit (e.g., the second internal circuit 120 of FIG. 1) configured to receive the second power supply voltage VDD2D increases rapidly, the level of the second power supply voltage VDD2D may decrease. Accordingly, the feedback voltage FB decreases, and the first voltage V1 and the second voltage V2 increase. Due to the increase in the second voltage V2, the amount of current flowing through the pass transistor PT may increase. Accordingly, the amount of change in the second power supply voltage VDD2D may be compensated by increasing the second power supply voltage VDD2D.

In one embodiment, the stabilization of the second power supply voltage VDD2D via the voltage regulator 200 shown in FIG. 5 is performed via a feedback loop (or side-shift loop) by the inverting input stage of the compensator 201, and thus, does not have a fast response speed to sudden changes in the second power supply voltage VDD2D. Accordingly, an output capacitor Co having a relatively large capacity may be included to provide the (stable) second power supply voltage VDD2D.

FIG. 6 illustrates an embodiment in which the voltage regulator 200 of FIG. 1 is implemented as a buck converter.

Referring to FIG. 6, a voltage regulator 200*a* may include a voltage conversion circuit 211, a feedback circuit 213, a voltage control circuit 214, and an output capacitor Co.

The voltage conversion circuit 211 is configured to convert an input voltage, i.e., a first power supply voltage, VDD2C, based on a voltage control signal, e.g., a pulse frequency modulation (PFM) voltage control signal SPFM to generate an output voltage, i.e., a second power supply voltage, VDD2D, at the output node NO. The configuration of the voltage conversion circuit 211 in FIG. 6 corresponds to a buck converter.

The voltage conversion circuit 211 may include a switching controller 212, a pull-up transistor MP, a pull-down transistor MN, an inductor L, and a capacitor C.

The switching controller 212 may be configured to generate a pull-up control signal PD and a pull-down control signal ND, based on the PFM voltage control signal SPFM.

The pull-up transistor MP may be turned on when the pull-up control signal PD is activated to a low level to pull up the voltage of the power switching node NX.

The pull-down transistor MN may be turned on when the pull-down control signal ND is activated to a high level to pull down the voltage of the power switching node NX.

The inductor L and capacitor C may act as a low-pass filter to filter the voltage at the power switching node NX to output an output voltage VO to the output node NO.

The configuration of the switching circuit including the pull-up transistor MP and the pull-down transistor MN and the low-pass filter including the inductor L and the capacitor C may be varied.

The voltage control circuit 214 may be configured to generate the PFM voltage control signal SPFM based on the feedback voltage FB proportional to the second power supply voltage VDD2D. In an example embodiment, the voltage control circuit 214 may be implemented as a comparator COM. The feedback voltage FB may be applied to the positive input terminal of the comparator COM and the reference voltage VREF may be applied to the negative input terminal, and the PFM voltage control signal SPFM may be generated at the output terminal.

The feedback circuit 213 may be configured to generate the feedback voltage FB proportional to the second power supply voltage VDD2D. The feedback circuit 213 may be configured to utilize the division resistors R1 and R2 to provide a feedback voltage FB corresponding to a ratio of the resistor values, for example, as shown in FIG. 6, but example embodiments are not limited thereto. In the embodiment of FIG. 6, the relationship FB=VDD2D*R1/(R1+R2) is satisfied.

The voltage regulator 200*a* may be configured to convert the first power supply voltage VDD2C (corresponding to the input voltage) to generate the second power supply voltage VDD2D (corresponding to the output voltage) through the output node NO.

The output capacitor Co is connected to the output node NO and may have a fixed capacitance or a variable capacitance.

Figure 7:
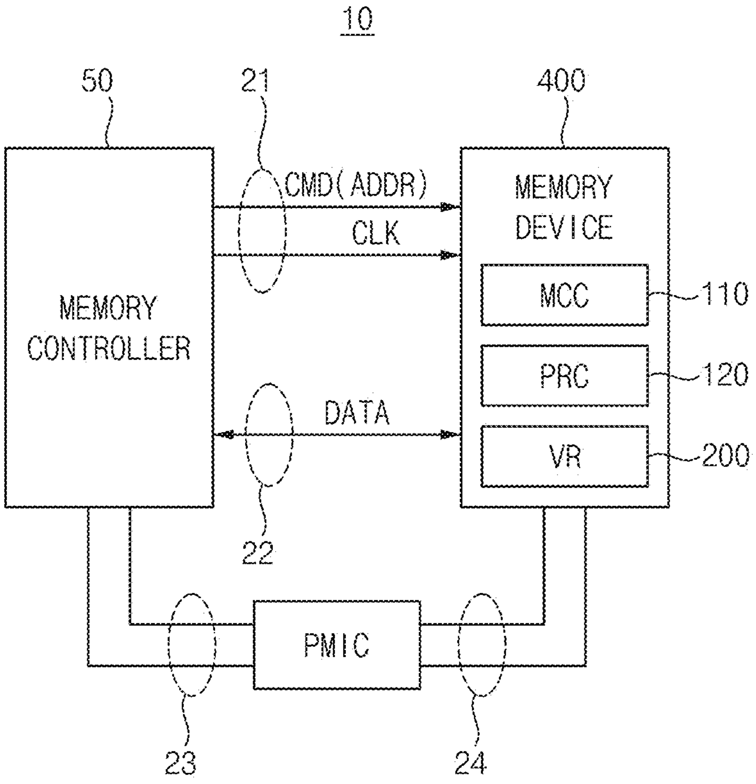
FIG. 7 is a block diagram illustrating a memory system according to example embodiments.

FIG. 7 is a block diagram illustrating a memory system according to example embodiments.

Referring to FIG. 7, a memory system 10 includes a memory controller 50, a semiconductor memory device 400, and a PMIC. Each of the memory controller 50 and the semiconductor memory device 400 include interfaces for communicating with each other.

The interfaces may be connected via a control bus 21 for transmitting commands CMD, access addresses ADDR, clock signals CLK, and the like. The interfaces may be connected via a data bus 22 for transmitting data.

The PMIC may provide power to the semiconductor memory device 400 and memory controller 50 via one or more power rails 23 and 24.

Depending on the type of semiconductor memory device, the command CMD may be considered to include the access address ADDR. The memory controller 50 may be configured to generate commands CMD to control the semiconductor memory device 400, and under the control of the memory controller 50, data may be written to the semiconductor memory device 400 or data may be read from the semiconductor memory device 400.

As shown in FIG. 7, the semiconductor memory device 400 may include a voltage regulator VR 200, a memory core circuit MCC 110 corresponding to the first internal circuit 110 described above, and a peripheral circuit PRC 120 corresponding to the second internal circuit 120 described above.

As described above, the voltage regulator 200 may convert the first power supply voltage VDD2C provided via the first voltage terminal PD1 to generate the second power supply voltage VDD2D that is lower than the first power supply voltage VDD2C. As described above with reference to FIGS. 5 and 6, the voltage regulator 200 may be implemented in various types and configurations.

The memory core circuit 110 (corresponding to the first internal circuit 110 described above) may receive the first power supply voltage VDD2C from the first voltage terminal PD1 and operate based on the first power supply voltage VDD2C.

The peripheral circuit 120 (corresponding to the second internal circuit 120 described above) may receive the second power supply voltage VDD2D from the second voltage terminal PD2 or the voltage regulator 200, based on the mode signal MD indicating the SPRM or the DPRM and operate based on the second power supply voltage VDD2D.

Figure 8:
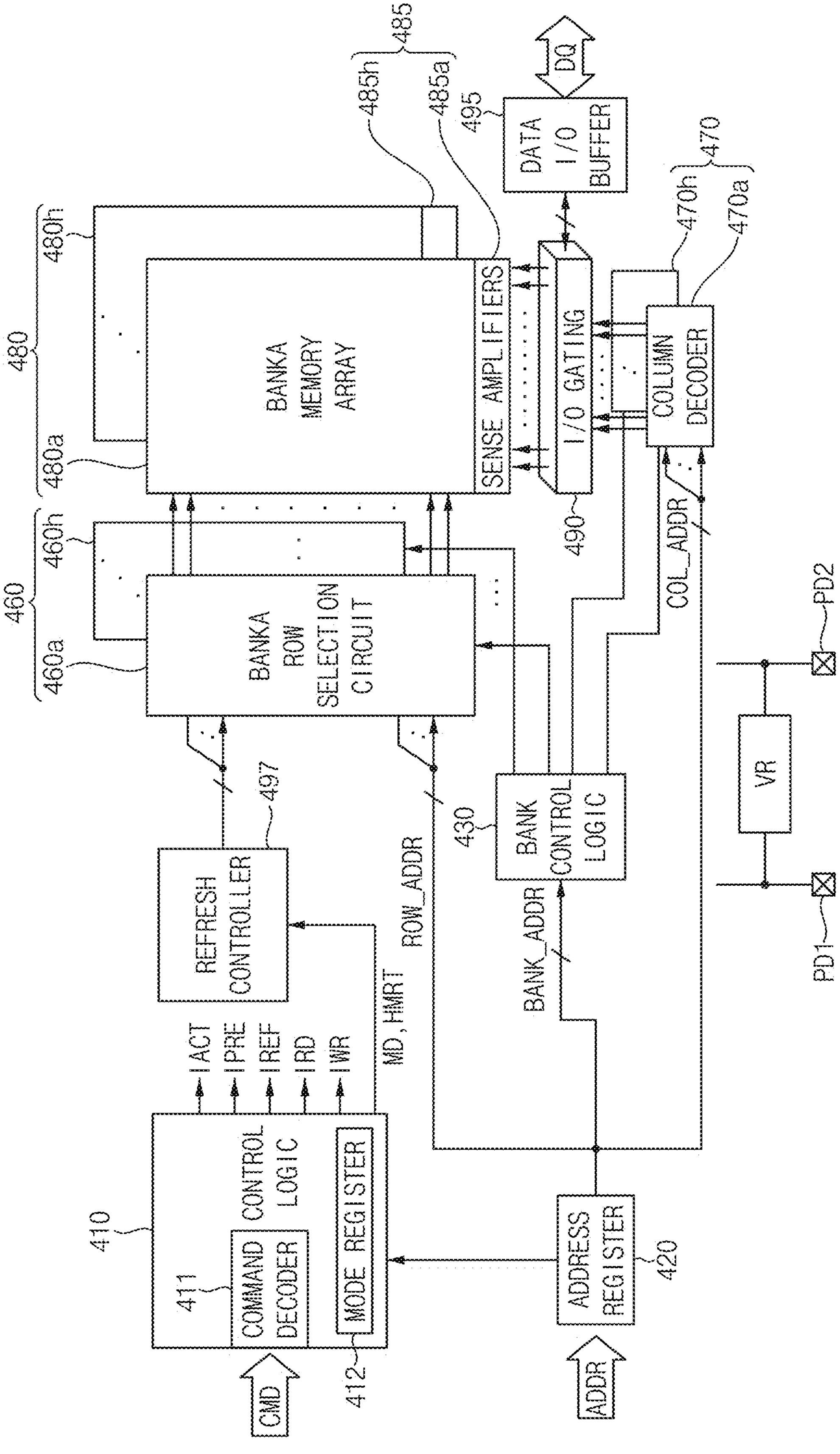
FIG. 8 is a block diagram illustrating a semiconductor memory device according to example embodiments.

FIG. 8 is a block diagram illustrating a semiconductor memory device according to example embodiments.

Referring to FIG. 8, a memory device 400 may include a command control logic 410, an address register 420, a bank control logic 430, a row selection circuit 460 (or row decoder), a column decoder 470, a memory cell array 480, a sense amplifier unit 485, an input/output (I/O) gating circuit 490, a data input/output (I/O) buffer 495, a refresh controller 497, a first voltage terminal PD1, a second voltage terminal PD2 and a voltage regulator VR. The memory cell array 480 and the sense amplifier portion 485 may correspond to the memory core circuit MCC, and the other components other than the memory cell array 480 and the sense amplifier portion 485 may correspond to the peripheral circuit PRC. In other words, the memory cell array 480 and sense amplifier 485 may be designed to operate based on the first supply voltage VDD2C and the other components may be implemented to operate based on the second supply voltage VDD2D.

The memory cell array 480 may include a plurality of bank arrays 480*a*, . . . , 480*h*. The row selection circuit 460 may include a plurality of bank row selection circuits 460*a*, . . . , 460*h* respectively coupled to the bank arrays 480*a*, . . . , 480*h*. The column decoder 470 may include a plurality of bank column decoders 470*a*, . . . , 470*h* respectively coupled to the bank arrays 480*a*, . . . , 480*h*. The sense amplifier unit 485 may include a plurality of bank sense amplifiers 485*a*, . . . , 485*h* respectively coupled to the bank arrays 480*a*, . . . , 480*h*.

The address register 420 may receive an address ADDR including a bank address BANK_ADDR, a row address ROW_ADDR, and a column address COL_ADDR from the memory controller 50. The address register 420 may provide the received bank address BANK_ADDR to the bank control logic 430, may provide the received row address ROW_ADDR to the row selection circuit 460, and may provide the received column address COL_ADDR to the column decoder 470.

The bank control logic 430 may be configured to generate bank control signals in response to the bank address BANK_ADDR. One of the bank row selection circuits 460*a*, . . . , 460*h* (corresponding to the bank address BANK_ADDR) may be activated in response to the bank control signals, and one of the bank column decoders 470*a*, . . . , 470*h* corresponding to the bank address BANK_ADDR may be activated in response to the bank control signals.

The row address ROW_ADDR from the address register 420 may be applied to the bank row selection circuits 460*a*, . . . , 460*h*. The activated one of the bank row selection circuits 460*a*, . . . , 460*h* may decode the row address ROW_ADDR, and may activate a wordline corresponding to the row address ROW_ADDR. For example, the activated bank row selection circuit 460 may apply a wordline driving voltage to the wordline corresponding to the row address ROW_ADDR.

The column decoder 470 may include a column address latch. The column address latch may receive the column address COL_ADDR from the address register 420, and may temporarily store the received column address COL_ADDR. In some example embodiments, in a burst mode, the column address latch may generate column addresses that increment from the received column address COL_ADDR. The column address latch may apply the temporarily stored or generated column address to the bank column decoders 470*a*, . . . , 470*h*.

The activated one of the bank column decoders 470*a*, . . . , 470*h* may decode the column address COL_ADDR, and may control the I/O gating circuit 490 in order to output data corresponding to the column address COL_ADDR.

The I/O gating circuit 490 may include a circuitry for gating input/output data. The I/O gating circuit 490 may further include read data latches for storing data that is output from the bank arrays 480*a*, . . . , 480*h*, and write drivers for writing data to the bank arrays 480*a*, . . . , 480*h*.

In some embodiments, data to be read from one bank array of the bank arrays 480*a*, . . . , 480*h* may be sensed by one of the bank sense amplifiers 485*a*, . . . , 485*h* coupled to the one bank array from which the data is to be read, and may be stored in the read data latches. The data stored in the read data latches may be provided to the memory controller 50 via the data I/O buffer 495. Data DQ to be written in one bank array of the bank arrays 480*a*, . . . , 480*h* may be provided to the data I/O buffer 495 from the memory controller 50. The write driver may write the data DQ in one bank array of the bank arrays 480*a*, . . . , 480*h*.

The command control logic 410 may control operations of the memory device 400. For example, the command control logic 410 may generate control signals for the memory device 400 in order to perform a write operation, a read operation, or a refresh operation. The command control logic 410 may generate internal command signals such as an active signal IACT, a precharge signal IPRE, a refresh signal IREF, a read signal IRD, a write signal IWR, etc., based on commands CMD transferred from the memory controller 50 in FIG. 7. The command control logic 410 may include a command decoder 411 that decodes the commands CMD received from the memory controller 50 and a mode register 412 that sets an operation mode of the memory device 400.

FIG. 8 illustrates the command control logic 410 and the address register 420 as being distinct from each other. In some embodiments, the command control logic 410 and the address register 420 may be implemented as a single integrated circuit. In addition, FIG. 8 illustrates the command CMD and the address ADDR being provided as distinct signals. In some embodiments, the command CMD and the address ADDR may be provided as a combined signals, e.g., as specified by DDR5, HBM, LPDDR5 and LPDDR6 standards.

According to example embodiments, the voltage regulator VR may convert the first supply voltage VDD2C provided through the first voltage terminal PD1 to generate the second supply voltage VDD2D that is lower than the first supply voltage VDD2C. As described above, the voltage regulator VR may be selectively enabled based on the mode signal MD. As described above with reference to FIG. 2, the voltage regulator VR may be disabled in the DPRM. On the other hand, as described above with reference to FIGS. 3 and 4, the voltage regulator VR may be enabled in the SPRM, convert the first power supply voltage VDD2C to generate the second power supply voltage VDD2D that is lower than the first power supply voltage VDD2C, and provide the generated second power supply voltage VDD2D to the peripheral circuitry PRC other than the memory core circuitry MCC.

Figure 9:
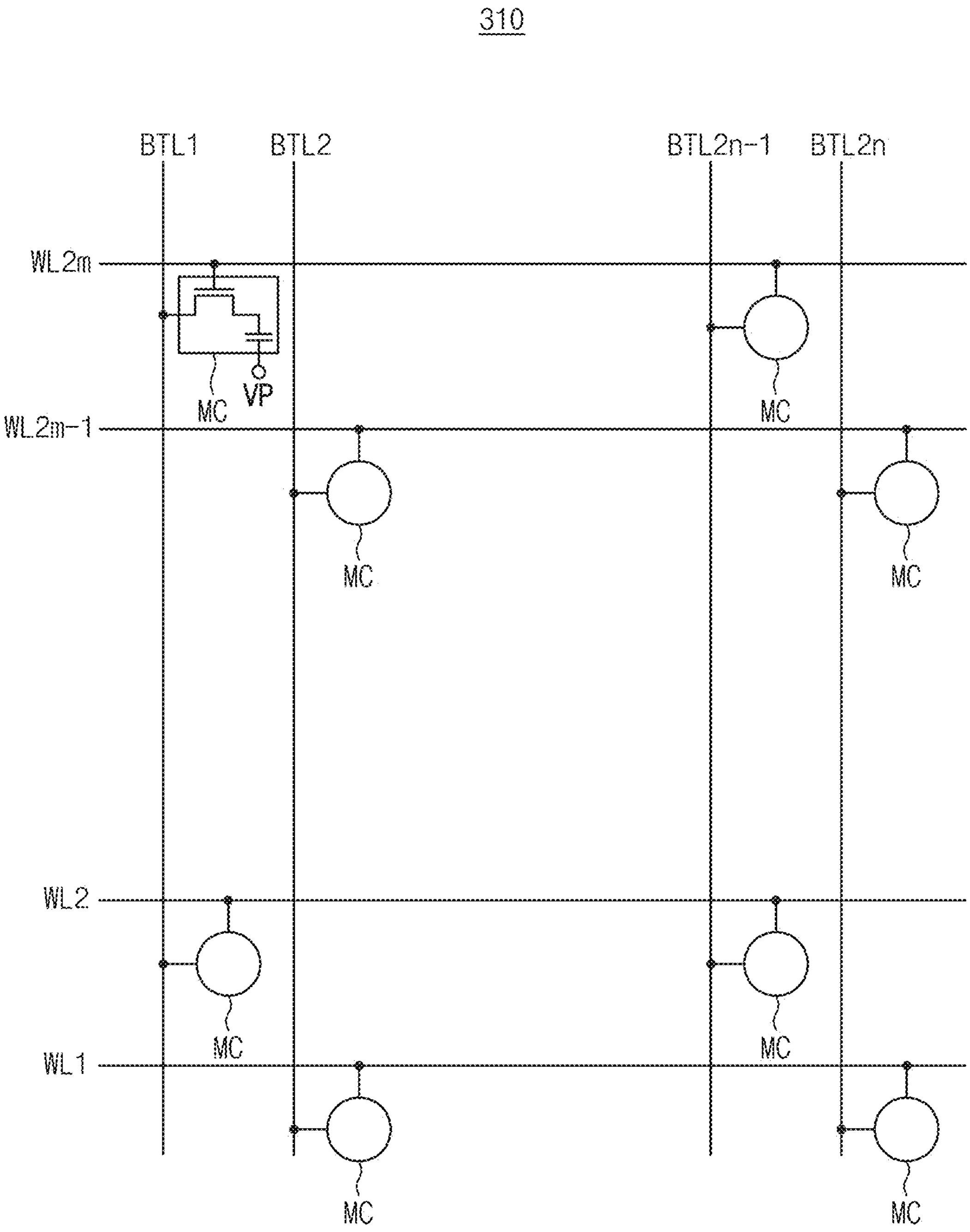
FIG. 9 is a diagram illustrating an example embodiment of a bank array included in a semiconductor memory device according to example embodiments.

FIG. 9 is a diagram illustrating an example embodiment of a bank array included in a semiconductor memory device according to example embodiments.

Referring to FIG. 9, a bank array 310 includes a plurality of wordlines WL1~WL2*m* (where m is a natural number greater than two), a plurality of bitlines BTL1~BTL2*n* (where n is a natural number greater than two), and a plurality of memory cells MCs disposed near intersections between the wordlines WL1~WL2*m* and the bitlines BTL1~BTL2*n*. In some example embodiments, each of the plurality of memory cells MCs may include a DRAM cell structure as illustrated in FIG. 9. The memory cell MC may include a cell capacitor connected to a plate voltage VP and a cell transistor connected between each bitline and the cell capacitor, and the gate electrode of the cell transistor is connected to each wordline. The plurality of wordlines WL1~WL2*m* to which the plurality of memory cells MCs are connected may be referred to as rows of the bank array 310 and the plurality of bitlines BL1~BL3*n* to which the plurality of memory cells MCs are connected may be referred to as columns of the bank array 310.

FIG. 10 is a diagram illustrating example information in a mode register of a semiconductor memory device according to example embodiments.

In some embodiments, a semiconductor memory device may include a plurality of mode registers (e.g., the mode register 412 of FIG. 8) that store control values for controlling the operation of the semiconductor memory device. The memory controller 50 of FIG. 7 may provide the control values to be stored in the plurality of mode registers via a mode register write command (MRW). FIG. 10 illustrates an example of a thirteenth mode register MR13, which is one of the plurality of mode registers.

Referring to FIG. 10, the mode register MR13 may store a first operand OP[0] to an eighth operand OP[7]. The first and second operands OP[0] and OP[1] represent information about the thermal offset, the third operand OP[2] represents information about the reference voltage output VRO, and the fifth operand OP[4] represents information about the data mask inversion DMI input/output (I/O) control, the sixth operand OP[5] represents information about Data Mask Disable (DMD), the seventh operand OP[6] represents information about Command Bus Training (CBT) mode, and the eighth operand OP[7] indicates information about Dual Power Voltage (Dual VDD2). The third operand OP[3] may be reserved for future use (RFU).

In an example embodiment, a value of "0" for the eighth operand OP[7] may indicate the DPRM and a value of "1" for the eighth operand OP[7] may indicate the SPRM. A control logic circuit (a controller) of the semiconductor memory device (e.g., command control logic 410 of FIG. 8) may generate the mode signal MD described above based on control values stored in such mode registers, e.g., the eighth operand OP[7] of FIG. 10.

Figure 11:
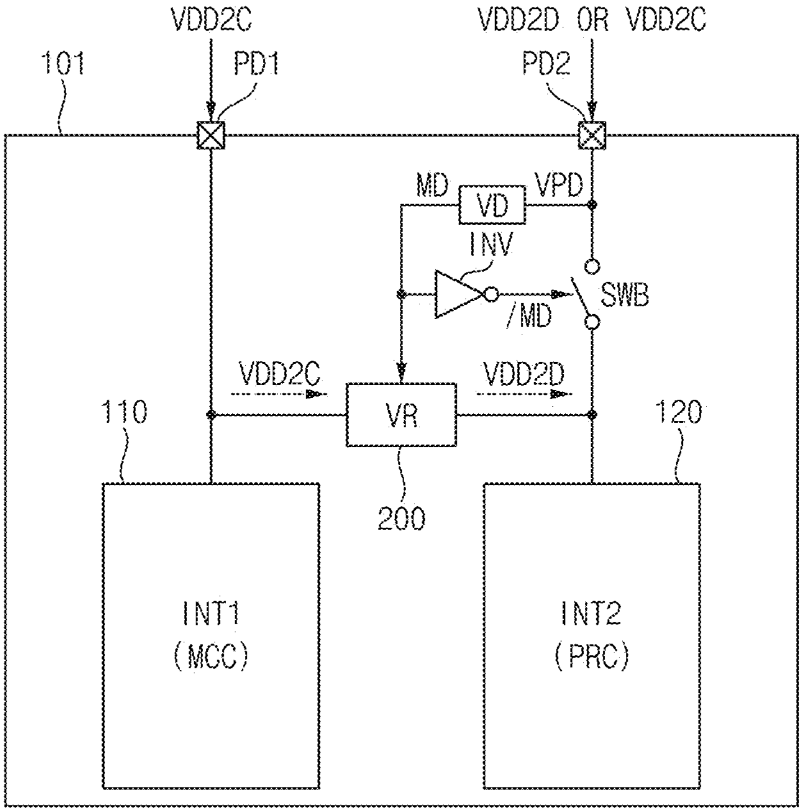
FIG. 11 is a block diagram illustrating a semiconductor device according to example embodiments.
Figure 12:
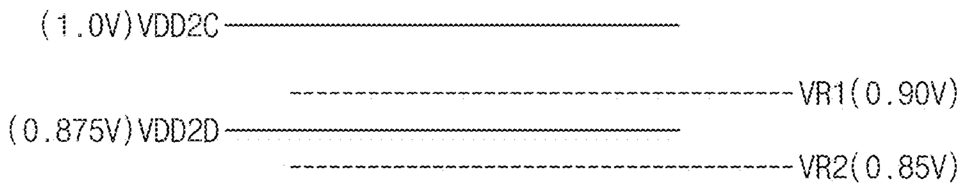
FIG. 12 is a diagram for describing operation of a voltage monitor included in the semiconductor device of FIG. 11.

FIG. 11 is a block diagram illustrating a semiconductor device according to example embodiments. FIG. 12 is a diagram for describing operation of a voltage monitor included in the semiconductor device of FIG. 11. Hereinafter, descriptions that are redundant with FIGS. 1 through 4 may be omitted.

Referring to FIG. 11, a semiconductor device 101 includes a first voltage terminal PD1, a second voltage terminal PD2, a voltage regulator (VR) 200, a first internal circuit (INT1) 110, a second internal circuit (INT2) 120, a voltage monitor VD, and a voltage disconnection switch SWB.

As described above with reference to FIGS. 2, 3 and 4, the first voltage terminal PD1 may receive the first power supply voltage VDD2C regardless of the power rail mode. Meanwhile, the second voltage terminal PD2 may receive the first power supply voltage VDD2C, may receive the second power supply voltage VDD2D, or may be floated, depending on the power rail mode.

The voltage regulator 200 may be configured to convert the first power supply voltage VDD2C provided through the first voltage terminal PD1 to generate the second power supply voltage VDD2D that is lower than the first power supply voltage VDD2C. As described above with reference to FIGS. 5 and 6, the voltage regulator 200 may be implemented in various types and configurations.

The first internal circuit 110 may be configured to receive the first power supply voltage VDD2C form the first voltage terminal PD1 and may operate based on the first power supply voltage VDD2C.

The second internal circuit 120 may be configured to receive the second power supply voltage VDD2D from the second voltage terminal PD2 or the voltage regulator 200 based on the mode signal MD indicating the SPRM or the DPRM, and may operate based on the second power supply voltage VDD2D.

The voltage monitor VD may be configured to monitor the voltage at the second voltage terminal PD2, i.e., the terminal voltage VPD, to generate the mode signal MD.

In an example embodiment, as shown in FIG. 12, the first power supply voltage VDD2C may be about 1.0 V, the second power supply voltage VDD2D may be about 0.875 V, and the ground voltage VSS may be 0 V. In this case, the voltage monitor VD may be configured to generate the mode signal MD by comparing the terminal voltage VPD corresponding to the second power supply voltage VDD2D in the SPRM with a upper limit voltage VR1 and a lower limit voltage VR2. For example, the upper limit voltage VR1 may be set to about 0.9V and the lower limit voltage VR2 may be set to about 0.85V.

The voltage monitor VD may be configured to set the mode signal MD to a first logic level to indicate the SPRM when the terminal voltage VPD is in a range between the upper limit voltage VR1 and the lower limit voltage VR2, and may otherwise set the mode signal MD to a second logic level to indicate the DPRM. For example, as will be described below with reference to FIG. 14, the first logic level indicating the SPRM may be a logic low level L and the second logic level indicating the DPRM may be a logic high level H.

In an example embodiment, the voltage disconnection switch SWB may be turned on or off based on an inverted signal/MD from inverter INV. As will be described below with reference to FIG. 14, the voltage disconnection switch SWB may be turned on in the DPRM to electrically connect the second voltage terminal PD2 and the second internal circuit 120, and may be turned off in the SPRM to disconnect the second voltage terminal PD2 and the second internal circuit 120. As such, the voltage disconnection switch SWB may control the electrical connection between the second voltage terminal PD2 and the second internal circuit 120 based on the mode signal MD indicating the DPRM or the SPRM.

Figures 13, 14:
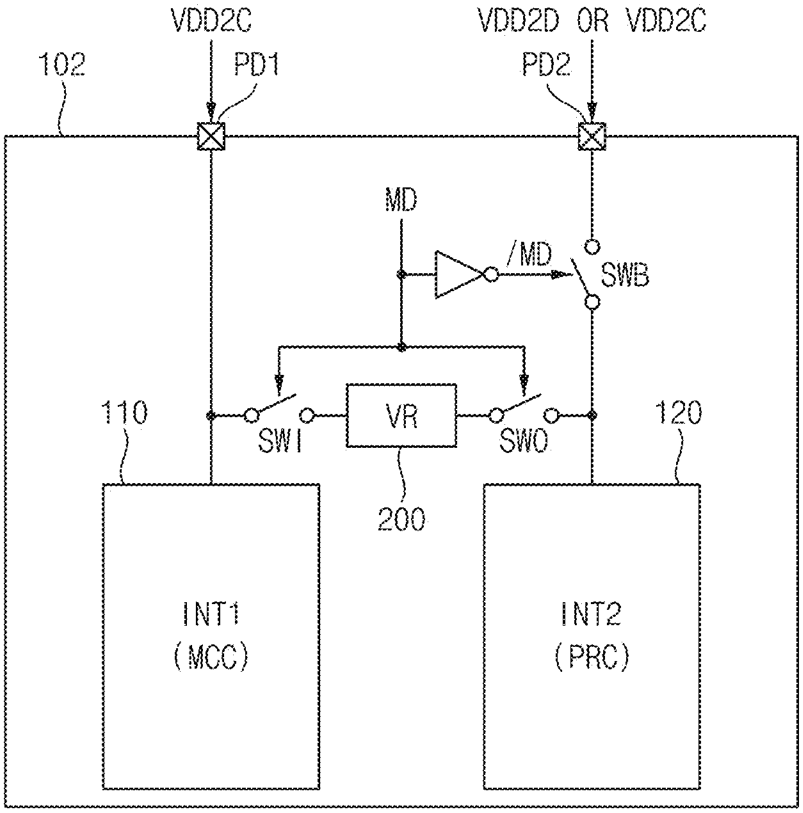
FIG. 13 is a block diagram illustrating a semiconductor device according to example embodiments.
FIG. 14 is a diagram illustrating operation of switches included in the semiconductor device of FIG. 13.

FIG. 13 is a block diagram illustrating a semiconductor device according to example embodiments. FIG. 14 is a diagram illustrating operation of switches included in the semiconductor device of FIG. 13.

Referring to FIG. 13, a semiconductor device 102 includes a first voltage terminal PD1, a second voltage terminal PD2, a voltage regulator (VR) 200, a first internal circuit (INT1) 110, a second internal circuit (INT2) 120, a voltage disconnection switch SWB, a regulator input switch SWI, and a regulator output switch SWO.

As described above with reference to FIGS. 2, 3 and 4, the first voltage terminal PD1 may receive the first power supply voltage VDD2C regardless of the power rail mode. The second voltage terminal PD2 may receive the first power supply voltage VDD2C, may receive the second power supply voltage VDD2D, or may be floated, depending on the power rail mode.

The voltage regulator 200 may convert the first power supply voltage VDD2C provided through the first voltage terminal PD1 to generate the second power supply voltage VDD2D that is lower than the first power supply voltage VDD2C. As described above with reference to FIGS. 5 and 6, the voltage regulator 200 may be implemented in various types and configurations.

The first internal circuit 110 may be configured to receive the first power supply voltage VDD2C from the first voltage terminal PD1 and may be configured to operate based on the first power supply voltage VDD2C.

The second internal circuit 120 may be configured to receive the second power supply voltage VDD2D from the second voltage terminal PD2 or the voltage regulator 200 based on the mode signal MD indicating the SPRM or the DPRM, and may be configured to operate based on the second power supply voltage VDD2D.

In an example embodiment, the voltage disconnection switch SWB, the regulator input switch SWI, and the regulator output switch SWO may be implemented as P-type metal oxide semiconductor (PNOS) transistors. In this case, as shown in FIG. 14, a logic high level H of the mode signal MD may indicate the DPRM and a logic low level L of the mode signal MD may indicate the SPRM.

Referring to FIG. 14, in the DPRM, the regulator input switch SWI and the regulator output switch SWO may be turned off and the voltage disconnection switch SWB may be turned on. In contrast, in the SPRM, the regulator input switch SWI and regulator output switch SWO may be turned on and the voltage disconnection switch SWB may be turned off.

The regulator input switch SWI may be turned on in the SPRM to electrically connect the first voltage terminal PD1 and the voltage regulator 200, and may be turned off in the DPRM to disconnect the first voltage terminal PD1 and the voltage regulator 200. As such, the regulator input switch SWI may control the electrical connection between the first voltage terminal PD1 and the voltage regulator 200 based on the mode signal MD.

The regulator output switch SWO may be turned on in the SPRM to electrically connect the voltage regulator 200 and the second internal circuit 120, and turned off in the DPRM to disconnect the voltage regulator 200 and the second internal circuit 120. As such, the regulator output switch SWO may control the electrical connection between the voltage regulator 200 and the second internal circuit 120 based on the mode signal MD.

The voltage disconnection switch SWB may be turned on in the DPRM to electrically connect the second voltage terminal PD2 and the second internal circuit 120, and turned off in the SPRM to disconnect the second voltage terminal PD2 and the second internal circuit 120. As such, the voltage disconnection switch SWB may control the electrical connection between the second voltage terminal PD2 and the second internal circuit 120 based on the mode signal MD indicating DPRM or the SPRM.

As a result, as described with reference to FIG. 2, in the DPRM, the voltage regulator 200 may be disabled, the first internal circuit 110 may receive the first power supply voltage VDD2C from the first voltage terminal PD1, and the second internal circuit 120 may receive the second power supply voltage VDD2D from the second voltage terminal PD2. On the other hand, as described with reference to FIGS. 3 and 4, in the SPRM, the voltage regulator 200 may be enabled to generate the second power supply voltage VDD2D, the first internal circuit 110 may receive the first power supply voltage VDD2C from the first voltage terminal PD1, and the second internal circuit 120 may receive the second power supply voltage VDD2D from the voltage regulator 200.

As such, the semiconductor device and the memory system according to example embodiments may efficiently provide power supply voltages for internal circuits in response to (based on) changes in the power rail mode, thereby efficiently addressing reliability issues and timing margin issues associated with changes in the power rail mode.

Figure 15:
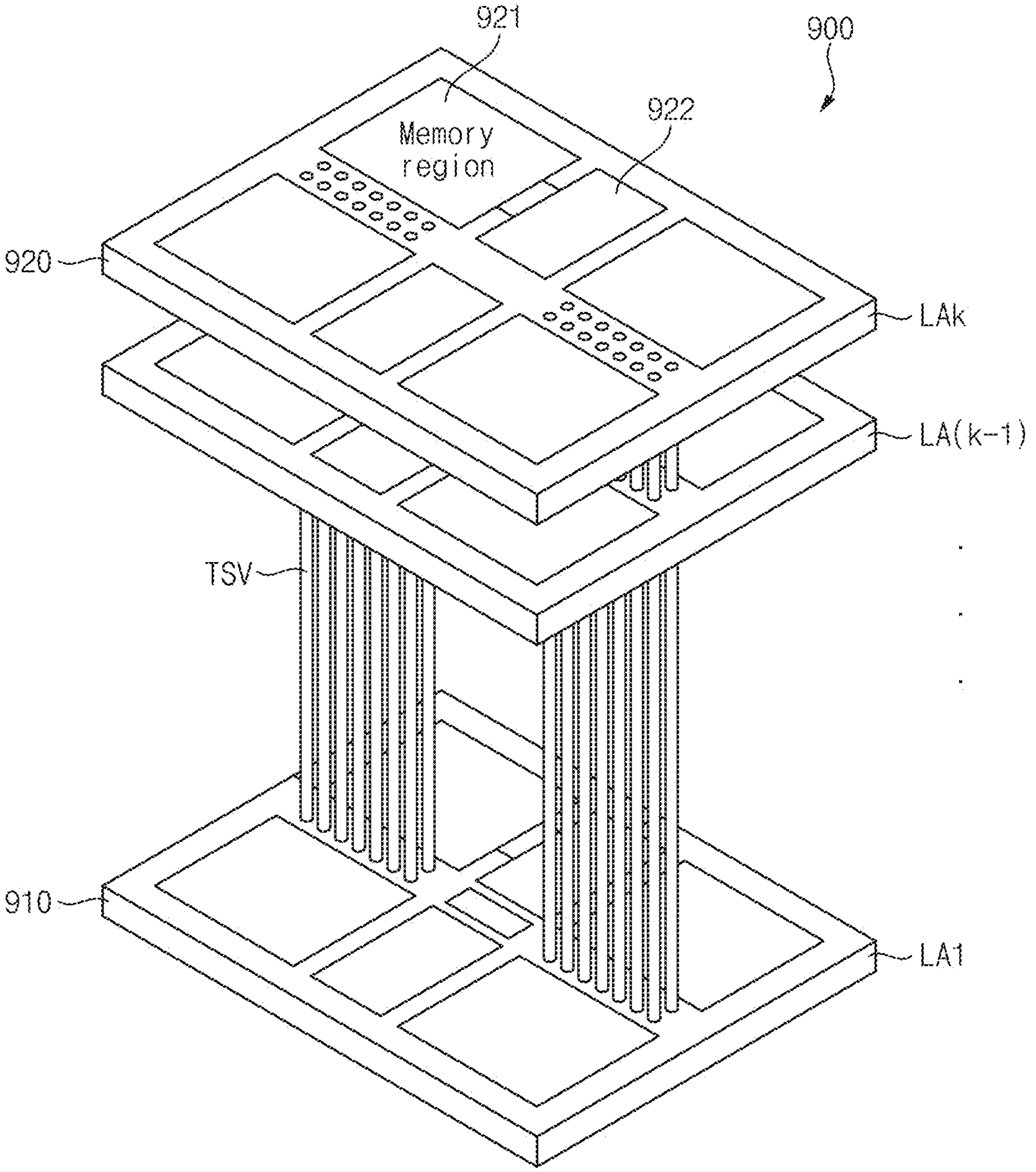
FIGS. 15 and 16 are diagrams illustrating a stacked semiconductor memory device according to example embodiments.
Figure 16:
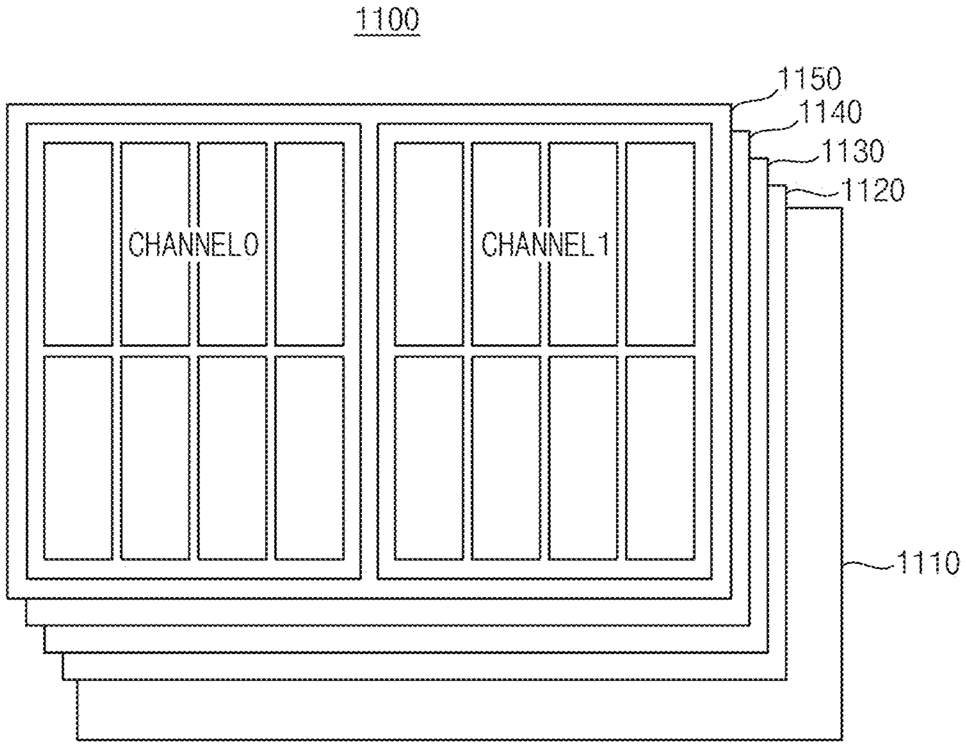

FIGS. 15 and 16 are diagrams illustrating a stacked semiconductor memory device according to example embodiments.

Referring to FIG. 15, a semiconductor memory device 900 may include first through $k^{th}$ semiconductor integrated circuit layers LA1 910 through LAk 920, in which the lowest, first semiconductor integrated circuit layer LA1 may be an interface or may control chip, and the other semiconductor integrated circuit layers LA2 through LAk 920 may be slave chips including core memory chips. The slave chips may form a plurality of memory ranks.

The first through $k^{th}$ semiconductor integrated circuit layers LA1 through LAk may transmit and receive signals between the layers by through-substrate vias through-silicon vias (TSVs). The lowest first semiconductor integrated circuit layer LA1, as the interface or control chip, may communicate with an external memory controller through a conductive structure formed on an external surface.

Each of the first semiconductor integrated circuit layer LA1 910 through the $k^{th}$ semiconductor integrated circuit layer LAk 920 may include memory regions 921 and peripheral circuits 922 for driving the memory regions 921. For example, the peripheral circuits 922 may include a row-driver for driving wordlines of a memory, a column-driver for driving bitlines of the memory, a data input-output circuit for controlling input-output of data, a command buffer for receiving a command from an outside source and buffering the command, and an address buffer for receiving an address from an outside source and buffering the address.

The first semiconductor integrated circuit layer LA1 910 may further include a control circuit. The control circuit may control access to the memory region 921 based on a command and an address signal from a memory controller and may generate control signals for accessing the memory region 921.

The first semiconductor layer 910 may include a voltage regulator. As described above, the voltage regulator may be selectively enabled based on the mode signal MD and may convert the first supply voltage VDD2C provided through the first voltage terminal PD1 to generate the second supply voltage VDD2D that is lower than the first supply voltage VDD2C.

FIG. 16 illustrates an example high bandwidth memory (HBM) organization. Referring to FIG. 16, a HBM 1100 may have a stack of multiple DRAM semiconductor dies 1120, 1130, 1140, and 1150. The HBM of the stack structure may be optimized by a plurality of independent interfaces, i.e., channels. Each DRAM stack may support up to 8 channels in accordance with HBM standards. FIG. 16 shows an example stack containing 4 DRAM semiconductor dies 1120, 1130, 1140, and 1150, and each DRAM semiconductor die supports two channels CHANNEL0 and CHANNEL1.

Each channel may provide access to an independent set of DRAM banks. Requests from one channel may not access data attached to a different channel. Channels are independently clocked, and need not be synchronous.

The HBM 1100 may further include an interface die 1110 or a logic die at bottom of the stack structure to provide signal routing and other functions. Some functions for the DRAM semiconductor dies 1120, 1130, 1140, and 1150 may be implemented in the interface die 1110.

According to example embodiments, the HBM 1100 may include a voltage regulator selectively enabled based on the mode signal as described above, and the voltage regulator may be utilized to efficiently provide power supply voltages to the internal circuits in response to a change in the power rail mode.

Figure 17:
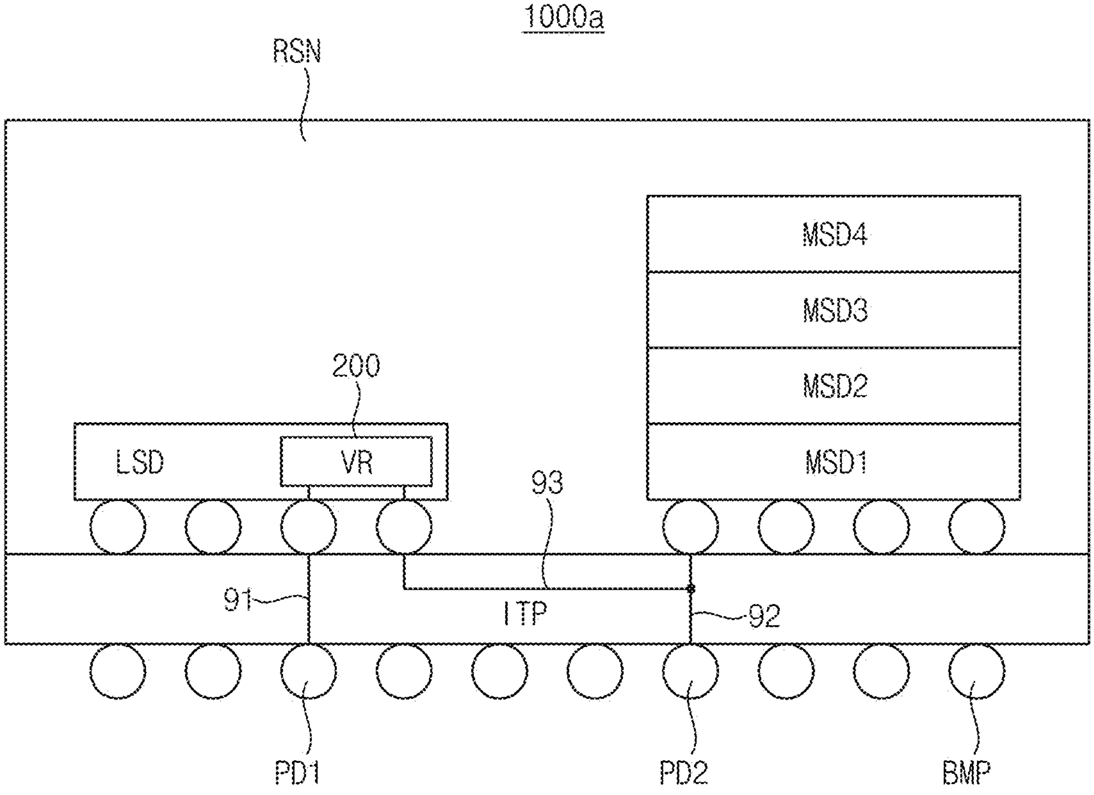
FIGS. 17 and 18 are diagrams illustrating packaging structure of a stacked semiconductor memory device according to example embodiments.
Figure 18:
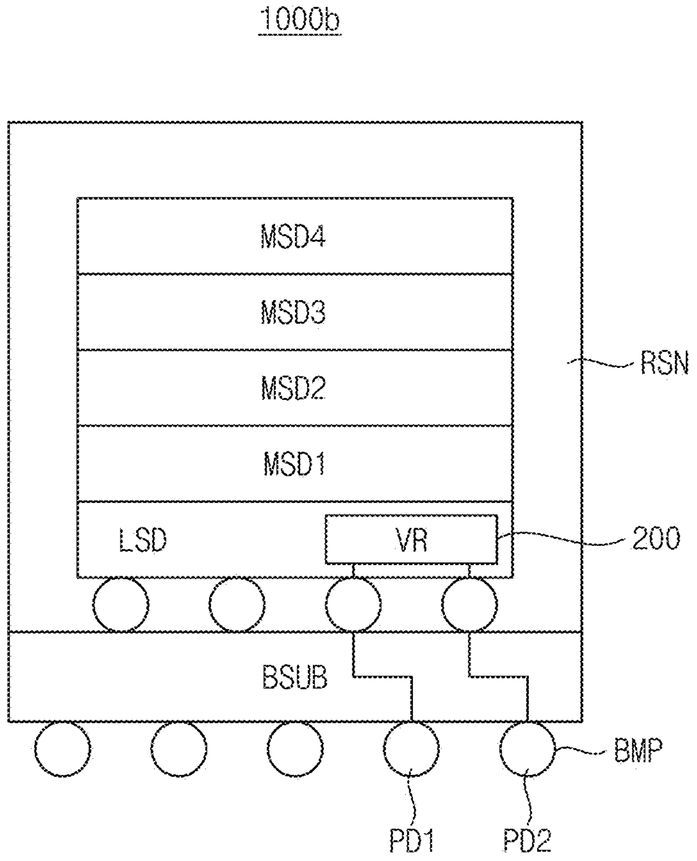

FIGS. 17 and 18 are diagrams illustrating packaging structure of a stacked semiconductor memory device according to example embodiments.

Referring to FIG. 17, a memory device 1000*a* may be a memory package, and may include a base substrate or an interposer ITP and a stacked memory device stacked on the interposer ITP. The stacked memory device may include a logic semiconductor die LSD (or a buffer semiconductor die) and a plurality of memory semiconductor dies MSD1, . . . , MSD4.

Referring to FIG. 18, a memory device 1000*b* may be a memory package and may include a base substrate BSUB and a stacked memory device stacked on the base substrate BSUB. The stacked memory device may include a logic semiconductor die LSD and a plurality of memory semiconductor dies MSD1, . . . , MSD4.

FIG. 17 illustrates a structure in which the memory semiconductor dies MSD1, . . . , MSD4 except for the logic semiconductor die LSD are stacked vertically and the logic semiconductor die LSD is electrically connected to the memory semiconductor dies MSD1, . . . , MSD4 through the interposer ITP or the base substrate. In contrast, FIG. 18 illustrates a structure in which the logic semiconductor die LSD is stacked vertically with the memory semiconductor dies MSD1, . . . , MSD4.

The base substrate BSUB may be the same as the interposer ITP or include the interposer ITP. The base substrate BSUB may be a PCB. External connecting elements such as conductive bumps BMP may be formed on a lower surface of the base substrate BSUB and internal connecting elements such as conductive bumps may be formed on an upper surface of the base substrate BSUB. In some example embodiments, the semiconductor dies LSD and MSD1, . . . , MSD4 may be electrically connected through through-silicon vias (TSV). In other example embodiments, the semiconductor dies LSD and MSD1, . . . , MSD4 may be electrically connected through the bonding wires. In still other example embodiments, the semiconductor dies LSD and MSD1, . . . , MSD4 may be electrically connected through a combination of the through-silicon vias and the bonding wires. In the example embodiment of FIG. 17, the logic semiconductor die LSD may be electrically connected to the memory semiconductor dies MSD1, . . . , MSD4 through conductive line patterns formed in the interposer ITP. The stacked semiconductor dies LSD and MSD1, . . . , MSD4 may be packaged using an encapsulant such as resin RSN.

The buffer semiconductor die LSD may include a voltage regulator 200 that is selectively enabled based on the mode signal as described above. The voltage regulator 200 may be selectively enabled based on the mode signal MD, and may convert the first supply voltage VDD2C provided through the first voltage terminal PD1 to generate the second supply voltage VDD2D that is lower than the first supply voltage VDD2C. As shown in FIG. 17, the first power supply voltage VDD2C may be provided to the buffer semiconductor die LSD via the first voltage terminal PD1 and the wiring 91, and the buffer semiconductor die LSD may operate based on the first power supply voltage VDD2C. In the DPRM, the second power supply voltage VDD2D may be provided to the semiconductor dies LSD, MSD1, . . . , MSD4 via the second voltage terminal PD2 and the wiring 92. In the SPRM, the second voltage terminal PD2 may be provided to the semiconductor dies LSD, MSD1, . . . , MSD4 from the voltage regulator 200 via the wiring 93. As a result, regardless of the power rail mode, the semiconductor dies LSD, MSD1, . . . , MSD4 may operate based on the second supply voltage VDD2D.

Figure 19:
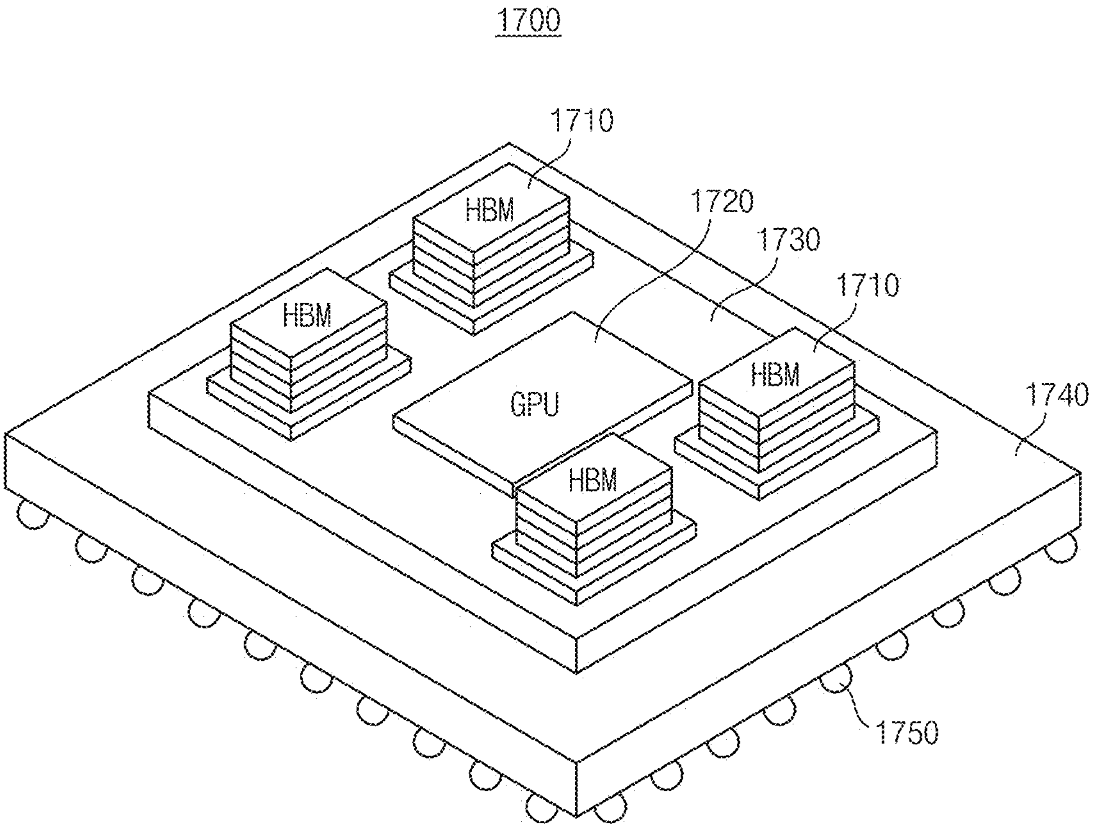
FIG. 19 is a diagram illustrating a semiconductor package including a stacked semiconductor memory device according to example embodiments.

FIG. 19 is a diagram illustrating a semiconductor package including a stacked semiconductor memory device according to example embodiments.

Referring to FIG. 19, a semiconductor package 1700 may include one or more stacked memory devices 1710 and a graphics processing unit (GPU) 1720 mounted on an interposer 1730, and the interposer on which the stacked memory device 1710 and the GPU 1720 are mounted may be mounted on a package substrate 1740. The package substrate 1740 is mounted on solder balls 1750. The GPU 1720 may perform the same operation as the memory controller as described above or may include the memory controller. The GPU 1720 may store data, which is generated or used in graphic processing in the stacked memory devices 1710.

The stacked memory device 1710 may be implemented in various forms, and the stacked memory device 1710 may be a memory device in a high bandwidth memory (HBM) form in which a plurality of layers are stacked. The stacked memory device 1710 may include a buffer die and a plurality of memory dies.

Figure 20:
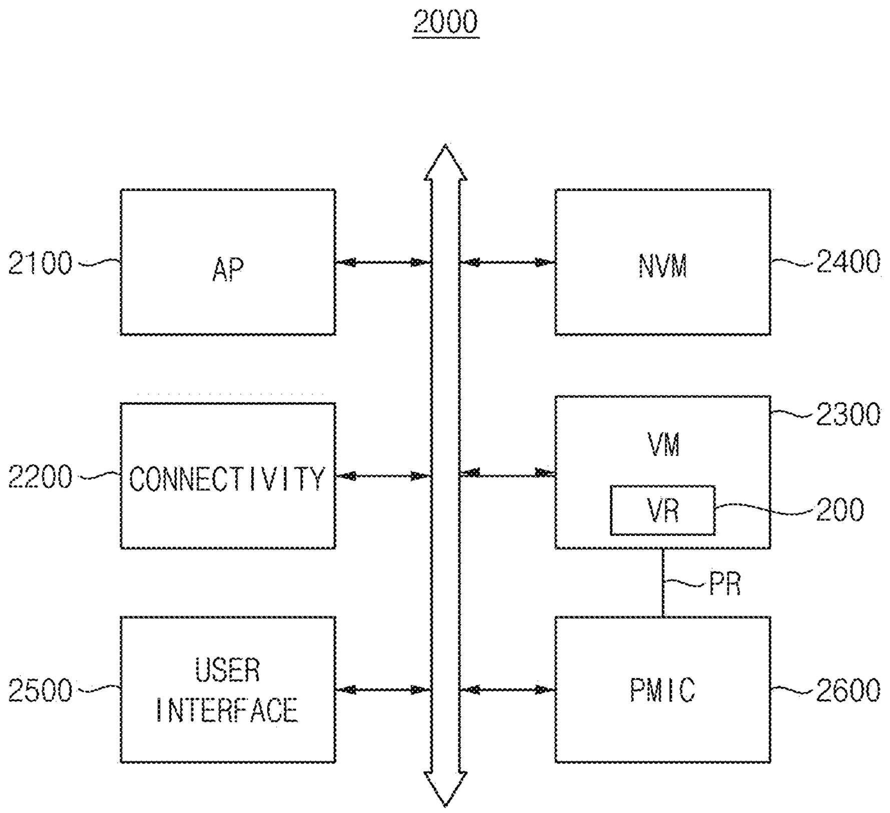
FIG. 20 is a block diagram illustrating a mobile system including a semiconductor memory device according to example embodiments.

FIG. 20 is a block diagram illustrating a mobile system including a semiconductor memory device according to example embodiments.

Referring to FIG. 20, a mobile system 2000 may include an application processor (AP) 2100, a connectivity unit 2200, a volatile memory device (VM) 2300, a nonvolatile memory device (NVM) 2040, a user interface 2500, and a power supply 2600. In some embodiments, the mobile system 2000 may be, for example, a mobile phone, a smart phone, a personal digital assistant (PDA), a portable multimedia player (PMP), a digital camera, a music player, a portable game console, a navigation system, or another type of electronic device.

The application processor 2100 may execute applications, e.g., a web browser, a game application, a video player, and so on. The connectivity unit 2200 may perform wired or wireless communication with an external device. The volatile memory device 2300 may store data processed by the application processor 2100 or may operate as a working memory. The nonvolatile memory device 2400 may store a boot image for booting the mobile system 2000. The user interface 2500 may include at least one input device, such as a keypad, a touch screen, etc., and at least one output device, such as a speaker, a display device, etc.

The power supply (e.g., the PMIC) 2600 may supply a power supply voltage to the mobile system 2000. As shown in FIG. 20, the power supply 2600 may be connected to the volatile memory device 2300 via one or more power rails PR.

The semiconductor memory device 2300 may include a voltage regulator 200 that is selectively enabled based on the mode signal as described above. The voltage regulator 200 may be selectively enabled based on the mode signal and may convert the first supply voltage VDD2C provided through the first voltage terminal PD1 to generate the second supply voltage VDD2D that is lower than the first supply voltage VDD2C.

As described above, the semiconductor device and memory system may efficiently provide power supply voltages for internal circuits in response to changes in a power rail mode, thereby efficiently addressing reliability issues and timing margin issues associated with changes in the power rail mode.

Embodiments described herein may be applied to any memory device and system included a memory device. For example, embodiments may be applied to systems such as a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, a server system, an automotive device, etc.

The foregoing is illustrative of example embodiments and is not to be construed as limiting thereof. Although a few example embodiments have been described, those skilled in the art will readily appreciate that many modifications are possible in the example embodiments without materially departing from the present disclosure.

What is claimed is:

1. A semiconductor device comprising:

a first voltage terminal;

a second voltage terminal;

a voltage regulator configured to convert a first power supply voltage provided through the first voltage terminal to a second power supply voltage lower than the first power supply voltage;

a first internal circuit configured to:

receive the first power supply voltage from the first voltage terminal, and operate based on the first power supply voltage; and a second internal circuit configured to:

receive the second power supply voltage from the second voltage terminal or the voltage regulator, based on a mode signal indicating a mode between a single power rail mode (SPRM) and a dual power rail mode (DPRM), and operate based on the second power supply voltage, wherein the voltage regulator is configured to be disabled in the DPRM and enabled in the SPRM.

2. The semiconductor device of claim 1, further comprising:

a controller; and a mode register configured to store control values for controlling operations of the semiconductor device, wherein the controller is configured to generate the mode signal based on the control values stored in the mode register.

3. The semiconductor device of claim 1, further comprising a voltage monitor configured to generate the mode signal by monitoring a voltage of the second voltage terminal.

4. The semiconductor device of claim 1, wherein, in the DPRM, the semiconductor device is configured to:

receive the first power supply voltage via a first power rail connected to the first voltage terminal, and receive the second power supply voltage via a second power rail connected to the second voltage terminal.

5. The semiconductor device of claim 1, wherein the first internal circuit is further configured to receive the first power supply voltage from the first voltage terminal, and wherein the second internal circuit is further configured to receive the second power supply voltage from the second voltage terminal.

6. The semiconductor device of claim 1, wherein, in the SPRM, the semiconductor device is configured to receive the first power supply voltage via a power rail connected, in common, to the first voltage terminal and the second voltage terminal.

7. The semiconductor device of claim 1, wherein, in the SPRM, the semiconductor device is configured to receive the first power supply voltage via a power rail connected to the first voltage terminal, and wherein the second voltage terminal is floated without being connected to the power rail.

8. The semiconductor device of claim 1, wherein, in the SPRM, the voltage regulator is further configured to be enabled to generate the second power supply voltage, wherein the first internal circuit is further configured to receive the first power supply voltage from the first voltage terminal, and wherein the second internal circuit is further configured to receive the second power supply voltage from the voltage regulator.

9. The semiconductor device of claim 1, further comprising a voltage disconnection switch configured to control an electrical connection between the second voltage terminal and the second internal circuit, based on the mode signal.

10. The semiconductor device of claim 9, wherein the voltage disconnection switch is further configured to:

be turned on, in the DPRM, to electrically connect the second voltage terminal and the second internal circuit, and be turned off, in the SPRM, to electrically disconnect the second voltage terminal and the second internal circuit.

11. The semiconductor device of claim 1, further comprising a regulator input switch configured to control an electrical connection between the first voltage terminal and the voltage regulator, based on the mode signal.

12. The semiconductor device of claim 11, wherein the regulator input switch is further configured to:

be turned on, in the SPRM, to electrically connect the first voltage terminal and the voltage regulator, and be turned off, in the DPRM, to electrically disconnect the first voltage terminal and the voltage regulator.

13. The semiconductor device of claim 1, further comprising a regulator output switch configured to control an electrical connection between the voltage regulator and the second internal circuit, based on the mode signal.

14. The semiconductor device of claim 13, wherein the regulator output switch is further configured to:

be turned on, in the SPRM, to electrically connect the voltage regulator and the second internal circuit, and be turned off, in the DPRM, to electrically disconnect the voltage regulator and the second internal circuit.

15. A semiconductor memory device comprising:

a first voltage terminal;

a second voltage terminal;

a voltage regulator configured to convert a first power supply voltage provided through the first voltage terminal to a second power supply voltage lower than the first power supply voltage;

a memory core circuit configured to:

receive the first power supply voltage from the first voltage terminal, and operate based on the first power supply voltage; and a peripheral circuit configured to:

receive the second power supply voltage from either the second voltage terminal or the voltage regulator, based on a mode signal indicating a mode between a single power rail mode (SPRM) and a dual power rail mode (DPRM), and operate based on the second power supply voltage, wherein the voltage regulator is configured to be disabled in the DPRM and enabled in the SPRM.

16. The semiconductor memory device of claim 15, wherein, in the DPRM, the semiconductor memory device is configured to:

receive the first power supply voltage via a first power rail connected to the first voltage terminal, and receive the second power supply voltage via a second power rail connected to the second voltage terminal, wherein the memory core circuit is further configured to receive the first power supply voltage from the first voltage terminal, and wherein the peripheral circuit is further configured to receive the second power supply voltage from the second voltage terminal.

17. The semiconductor memory device of claim 15, wherein, in the SPRM, the semiconductor memory device is configured to receive the first power supply voltage via a power rail connected, in common, to the first voltage terminal and the second voltage terminal, and wherein, in the SPRM, the voltage regulator is further configured to be enabled to generate the second power supply voltage, wherein the memory core circuit is further configured to receive the first power supply voltage from the first voltage terminal, and wherein the peripheral circuit is further configured to receive the second power supply voltage from the voltage regulator.

18. The semiconductor memory device of claim 15, wherein the semiconductor memory device is in compliance with a Low Power Double Data Rate (LPDDR) standard.

19. A memory system comprising:

a semiconductor memory device;

a memory controller configured to control the semiconductor memory device;

one or more power rails; and a power management integrated circuit configured to supply power to the semiconductor memory device and the memory controller via the one or more power rails, wherein the semiconductor memory device comprises, a first voltage terminal;

a second voltage terminal;

a voltage regulator configured to convert a first power supply voltage provided through the first voltage terminal to a second power supply voltage lower than the first power supply voltage;

a memory core circuit configured to:

receive the first power supply voltage from the first voltage terminal, and operate based on the first power supply voltage; and a peripheral circuit configured to:

receive the second power supply voltage from either the second voltage terminal or the voltage regulator, based on a mode signal indicating a mode between a single power rail mode (SPRM) and a dual power rail mode (DPRM), and operate based on the second power supply voltage, and wherein the voltage regulator is configured to be disabled in the DPRM and enabled in the SPRM.

* * * * *